United States Patent
Deguchi

(10) Patent No.: US 10,483,186 B2
(45) Date of Patent: Nov. 19, 2019

(54) SEMICONDUCTOR DEVICE WITH HEAT RADIATOR

(71) Applicant: TOYOTA JIDOSHA KABUSHIKI KAISHA, Toyota-shi, Aichi (JP)

(72) Inventor: Masataka Deguchi, Nagoya (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 16/160,295

(22) Filed: Oct. 15, 2018

(65) Prior Publication Data

US 2019/0139858 A1 May 9, 2019

(30) Foreign Application Priority Data

Nov. 8, 2017 (JP) ................... 2017-215725
Feb. 2, 2018 (JP) ................... 2018-017436

(51) Int. Cl.

| H01L 23/373 | (2006.01) |
|---|---|
| H01L 23/367 | (2006.01) |
| H01L 23/31 | (2006.01) |
| F28F 21/02 | (2006.01) |
| H01L 23/492 | (2006.01) |
| H01L 23/433 | (2006.01) |

(52) U.S. Cl.
CPC .......... *H01L 23/3735* (2013.01); *F28F 21/02* (2013.01); *H01L 23/3107* (2013.01); *H01L 23/367* (2013.01); *H01L 23/373* (2013.01); *H01L 23/4334* (2013.01); *H01L 23/492* (2013.01); *H01L 2224/32245* (2013.01); *H01L 2224/33* (2013.01); *H01L 2924/181* (2013.01)

(58) Field of Classification Search
CPC ..... H01L 23/28; H01L 23/367; H01L 23/373; H01L 23/3735
See application file for complete search history.

(56) References Cited

U.S. PATENT DOCUMENTS

| 2012/0152510 A1* | 6/2012 | Noda .............. B23K 1/0016 |
| | | 165/185 |
| 2017/0229371 A1 | 8/2017 | Hiramitsu | |

FOREIGN PATENT DOCUMENTS

| JP | 2007-165620 A | 6/2007 |
| JP | 2013-254880 A | 12/2013 |
| JP | 2016-162888 A | 9/2016 |
| JP | 2017-112334 A | 6/2017 |

* cited by examiner

*Primary Examiner* — Robert G Bachner
*Assistant Examiner* — Molly K Reida
(74) *Attorney, Agent, or Firm* — Oliff PLC

(57) ABSTRACT

A first inner heat conductor may include a plurality of first graphite layers. A second inner heat conductor may include a plurality of second graphite layers. The plurality of first graphite layers may be stacked in a first direction which is orthogonal to a direction in which a semiconductor element and a first heat radiator are arranged. The plurality of second graphite layers may be stacked in the direction in which the semiconductor element and the first heat radiator are arranged, or may be stacked in a second direction which is orthogonal to the direction in which the semiconductor element and the first heat radiator are arranged and orthogonal to the first direction.

5 Claims, 7 Drawing Sheets

SEMICONDUCTOR DEVICE WITH HEAT RADIATOR

TECHNICAL FIELD

The technique disclosed herein relates to a semiconductor device.

BACKGROUND

A semiconductor device disclosed in Japanese Patent Application Publication No. 2017-112334 includes a semiconductor element and a heat radiator connected to a surface of the semiconductor element. The heat radiator includes a metal heat conductor connected to the surface of the semiconductor element. Moreover, the heat radiator includes a first heat conductor connected to the metal heat conductor and a second heat conductor stacked on the first heat conductor in a direction in which the semiconductor element and the heat radiator are arranged. The first heat conductor includes a plurality of first graphite layers. The plurality of first graphite layers is stacked in a first direction which is orthogonal to the direction in which the semiconductor element and the heat radiator are arranged. The second heat conductor includes a plurality of second graphite layers. The plurality of second graphite layers is stacked in the first direction which is orthogonal to the direction in which the semiconductor element and the heat radiator are arranged. Both of the plurality of first graphite layers and the plurality of second graphite layers are stacked in the first direction. In the semiconductor device in Japanese Patent Application Publication No. 2017-112334, to obtain a flexible heat conducting structure, the stacking direction of the plurality of first graphite layers and the stacking direction of the plurality of second graphite layers need to coincide with each other.

In the semiconductor device in Japanese Patent Application Publication No. 2017-112334, the semiconductor element generates heat when operating. The heat generated in the semiconductor element is radiated by the heat radiator. The heat is conducted and radiated by the metal heat conductor and the first and second heat conductors of the heat radiator. The heat generated in the semiconductor element is conducted firstly by the metal heat conductor connected to the semiconductor element, then by the first heat conductor connected to the metal heat conductor, and then by the second heat conductor stacked on the first heat conductor.

The first graphite layers have anisotropic heat conductivity. Each of the first graphite layers does not conduct much heat in the direction in which the plurality of first graphite layers is stacked. In contrast to this, each of the first graphite layers conducts heat with high heat conductivity in a direction orthogonal to the direction in which the plurality of first graphite layers is stacked. Therefore, the first heat conductor conducts heat with high heat conductivity in the direction in which the semiconductor element and the heat radiator are arranged (i.e., in the direction orthogonal to the direction in which the plurality of first graphite layers is stacked). Moreover, the first heat conductor conducts heat with high heat conductivity in a second direction (i.e., in the direction orthogonal to the direction in which the plurality of first graphite layers is stacked) which is orthogonal to the direction in which the semiconductor element and the heat radiator are arranged and orthogonal to the first direction.

Similarly, the second graphite layers have anisotropic heat conductivity. Each of the second graphite layers does not conduct much heat in the direction in which the plurality of second graphite layers is stacked. In contrast to this, each of the second graphite layers conducts heat with high heat conductivity in a direction orthogonal to the direction in which the plurality of second graphite layers is stacked. Therefore, the second heat conductor conducts heat with high heat conductivity in the direction in which the semiconductor element and the heat radiator are arranged (i.e., in the direction orthogonal to the direction in which the plurality of second graphite layers is stacked). Moreover, the second heat conductor conducts heat with high heat conductivity in the second direction (i.e., in the direction orthogonal to the direction in which the plurality of second graphite layers is stacked) which is orthogonal to the direction in which the semiconductor element and the heat radiator are arranged and orthogonal to the first direction.

SUMMARY

In the semiconductor device in Japanese Patent Application Publication No. 2017-112334, each of the first and second heat conductors conducts heat with high heat conductivity in the direction in which the semiconductor element and the heat radiator are arranged. Moreover, each of the first and second heat conductors conducts heat with high heat conductivity in the second direction which is orthogonal to the direction in which the semiconductor element and the heat radiator are arranged and orthogonal to the first direction. The first and second heat conductors do not conduct much heat in the first direction (in the direction in which the plurality of first graphite layers and the plurality of second graphite layers are stacked). Therefore, heat generated in the semiconductor element cannot be radiated sufficiently in the first direction, which results in a problem of low heat radiation performance. The disclosure herein provides a technique capable of improving heat radiation performance.

A semiconductor device disclosed herein may comprise a semiconductor element; and a first heat radiator connected to a first surface of the semiconductor element, wherein the first heat radiator may comprise: a first outer heat conductor constituted of metal and connected to the first surface of the semiconductor element; a first inner heat conductor disposed in the first outer heat conductor, and a second inner heat conductor disposed in the first outer heat conductor and stacked on the first inner heat conductor in a direction in which the semiconductor element and the first heat radiator are arranged, the first inner heat conductor may comprise a plurality of first graphite layers, the second inner heat conductor may comprise a plurality of second graphite layers, the plurality of first graphite layers may be stacked in a first direction which is orthogonal to the direction in which the semiconductor element and the first heat radiator are arranged, and the plurality of second graphite layers may be stacked in the direction in which the semiconductor element and the first heat radiator are arranged, or may be stacked in a second direction which is orthogonal to the direction in which the semiconductor element and the first heat radiator are arranged and orthogonal to the first direction.

According to this configuration, the semiconductor element generates heat when operating. The heat generated in the semiconductor element is radiated by the first heat radiator. The heat is conducted and radiated by the first outer heat conductor and the first and second inner heat conductors of the first heat radiator. The heat generated in the semiconductor element is conducted firstly by the first outer heat conductor constituted of metal and connected to the semiconductor element, then by the first and second inner heat conductors disposed in the first outer heat conductor, and then again by the first outer heat conductor, and is radiated to an outside.

The first inner heat conductor includes the plurality of first graphite layers, and the second inner heat conductor includes the plurality of second graphite layers. Graphite has heat conductivity higher than heat conductivity of metal. Therefore, the first heat radiator, which includes the plurality of first graphite layers and the plurality of second graphite layers, can conduct heat more efficiently than in a case of including only metal.

Each of the first graphite layers has anisotropic heat conductivity because of a bonding relation of carbon atoms in graphite. Each of the first graphite layers does not conduct much heat in a direction in which the plurality of first graphite layers is stacked. In contrast to this, each of the first graphite layers conducts heat with high heat conductivity in a direction orthogonal to the direction in which the plurality of first graphite layers is stacked. The plurality of first graphite layers is stacked in the first direction which is orthogonal to the direction in which the semiconductor element and the first heat radiator are arranged. Therefore, the first inner heat conductor conducts heat with high heat conductivity in the direction in which the semiconductor element and the first heat radiator are arranged (i.e., in the direction orthogonal to the direction in which the plurality of first graphite layers is stacked). Moreover, the first inner heat conductor conducts heat with high heat conductivity in the second direction (i.e., in the direction orthogonal to the direction in which the plurality of first graphite layers is stacked) which is orthogonal to the first direction.

Similarly, each of the second graphite layers has anisotropic heat conductivity because of the bonding relation of carbon atoms in graphite. Each of the second graphite layers does not conduct much heat in a direction in which the plurality of second graphite layers is stacked. In contrast to this, each of the second graphite layers conducts heat with high heat conductivity in a direction orthogonal to the direction in which the plurality of second graphite layers is stacked. In some aspects, the plurality of second graphite layers is stacked in the direction in which the semiconductor element and the first heat radiator are arranged. Therefore, the second inner heat conductor conducts heat with high heat conductivity in the first and second directions (both of which are directions orthogonal to the direction in which the plurality of second graphite layers is stacked) which are orthogonal to the direction in which the semiconductor element and the first heat radiator are arranged. Alternatively, in other aspects, the plurality of second graphite layers is stacked in the second direction which is orthogonal to the direction in which the semiconductor element and the first heat radiator are arranged and orthogonal to the first direction. Therefore, this second inner heat conductor conducts heat with high heat conductivity in the direction in which the semiconductor element and the first heat radiator are arranged (i.e., in the direction orthogonal to the direction in which the plurality of second graphite layers is stacked). Moreover, this second inner heat conductor conducts heat with high heat conductivity in the first direction (i.e., in the direction orthogonal to the direction in which the plurality of second graphite layers is stacked) orthogonal to the second direction.

According to the configuration above, the heat generated in the semiconductor element can be conducted to the first and second inner heat conductors by the first outer heat conductor constituted of metal. Moreover, the heat can be conducted with high heat conductivity by the first and second inner heat conductors in the direction in which the semiconductor element and the first heat radiator are arranged, in the first direction, and in the second direction. Moreover, the heat conducted by the first and second inner heat conductors can be radiated by the first outer heat conductor in multiple directions. Therefore, according to the configuration above, the heat generated in the semiconductor element can be conducted efficiently and radiated in multiple directions by the first outer heat conductor and the first and second inner heat conductors of the first heat radiator, so heat radiation performance can be improved.

The semiconductor device may further comprise a second heat radiator connected to a second surface opposite to the first surface of the semiconductor element. The second heat radiator may comprise: a second outer heat conductor constituted of metal and connected to the second surface of the semiconductor element; a third inner heat conductor disposed in the second outer heat conductor, and a fourth inner heat conductor disposed in the second outer heat conductor and stacked on the third inner heat conductor in a direction in which the semiconductor element and the second heat radiator are arranged. The third inner heat conductor may comprise a plurality of third graphite layers. The fourth inner heat conductor may comprise a plurality of fourth graphite layers. The plurality of third graphite layers may be stacked in a third direction which is orthogonal to the direction in which the semiconductor element and the second heat radiator are arranged. The plurality of fourth graphite layers may be stacked in the direction in which the semiconductor element and the second heat radiator are arranged, or may be stacked in a fourth direction which is orthogonal to the direction in which the semiconductor element and the second heat radiator are arranged and orthogonal to the third direction.

According to this configuration, the heat radiation performance can be improved not only on a first surface side of the semiconductor element but also on a second surface side thereof, which is opposite to the first surface side.

The semiconductor element, the first heat radiator and the second heat radiator may be sealed by a sealing resin.

The first outer heat conductor may comprise a projection projecting outward.

According to this configuration, heat capacity of the first heat radiator can be improved. Therefore, it is possible to suppress a sharp increase in temperature of the first heat radiator when the heat generated in the semiconductor element is conducted to the first heat radiator.

The semiconductor device may further comprise a second heat radiator connected to a second surface opposite to the first surface of the semiconductor element. The second heat radiator may be a solid metal member.

According to this configuration, it is possible to clearly identify the second heat radiator when the semiconductor device is inspected by using, for example, ultrasonic waves or X-rays.

DETAILED DESCRIPTION

Representative, non-limiting examples of the present invention will now be described in further detail with reference to the attached drawings. This detailed description is merely intended to teach a person of skill in the art further details for practicing preferred aspects of the present teachings and is not intended to limit the scope of the invention. Furthermore, each of the additional features and teachings disclosed below may be utilized separately or in conjunction with other features and teachings to provide improved semiconductor devices, as well as methods for using and manufacturing the same.

Moreover, combinations of features and steps disclosed in the following detailed description may not be necessary to practice the invention in the broadest sense, and are instead taught merely to particularly describe representative examples of the invention. Furthermore, various features of the above-described and below-described representative examples, as well as the various independent and dependent claims, may be combined in ways that are not specifically and explicitly enumerated in order to provide additional useful embodiments of the present teachings.

All features disclosed in the description and/or the claims are intended to be disclosed separately and independently from each other for the purpose of original written disclosure, as well as for the purpose of restricting the claimed subject matter, independent of the compositions of the features in the embodiments and/or the claims. In addition, all value ranges or indications of groups of entities are intended to disclose every possible intermediate value or intermediate entity for the purpose of original written disclosure, as well as for the purpose of restricting the claimed subject matter.

First Embodiment

Figure 1:
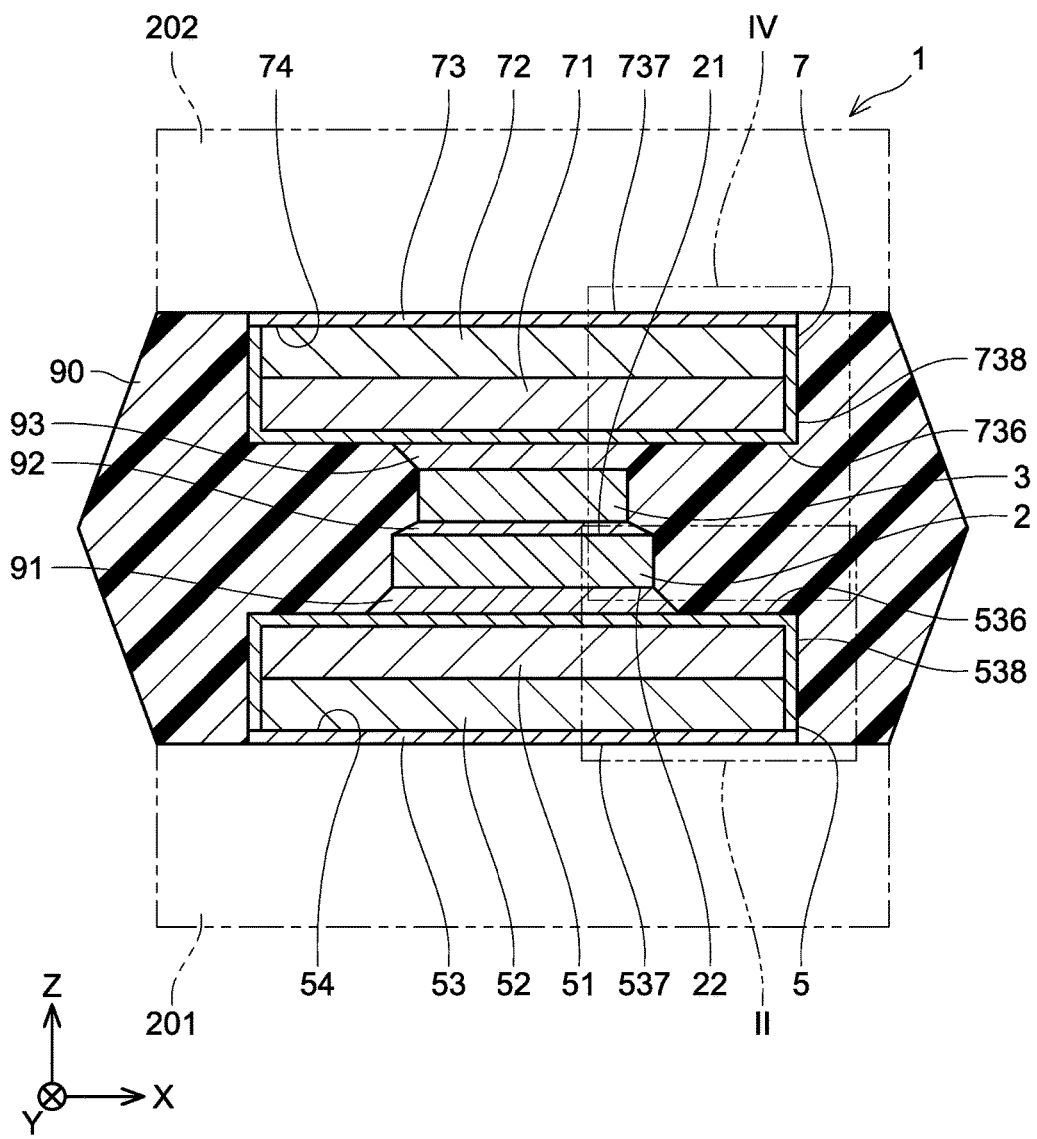
FIG. 1 is a cross-sectional view of a semiconductor device according to a first embodiment.

A semiconductor device 1 according to an embodiment will be described with reference to the drawings. As illustrated in FIG. 1, the semiconductor device 1 according to the embodiment includes a semiconductor element 2, a first heat radiator 5, a second heat radiator 7, and an electrically conductive plate 3. The semiconductor element 2, the first heat radiator 5, the second heat radiator 7, and the electrically conductive plate 3 are arranged in a Z direction. The semiconductor element 2, the first heat radiator 5, the second heat radiator 7, and the electrically conductive plate 3 are sealed by a sealing resin 90. A material that can be used for the sealing resin 90 includes an epoxy resin. The sealing resin 90 may additionally include a curing agent, a stress relaxing agent, a curing accelerator, a filler, and the like. The semiconductor device 1 illustrated in FIG. 1 may be called a power card.

The semiconductor element 2 is constituted of a substrate of, for example, silicon (Si), silicon carbide (SiC), or the like. The semiconductor element 2 is provided with an element structure therein such as an IGBT (Insulated Gate Bipolar Transistor), a MOSFET (Metal Oxide Semiconductor Field Effect Transistor), and the like. If the element structure is an IGBT, for example, the semiconductor element 2 includes an emitter region, a collector region, a body region, a drift region, a gate electrode, and the like (not illustrated). The semiconductor element 2 generates heat when the semiconductor device 1 operates.

On a front surface 21 of the semiconductor element 2, a front surface electrode is disposed (not illustrated). The front surface electrode covers the front surface 21 of the semiconductor element 2. The front surface electrode has electrical conductivity. The front surface electrode is constituted of, for example, an aluminum-silicon alloy (AlSi). The front surface electrode is electrically connected to, for example, the emitter region provided in the semiconductor element 2.

On a rear surface 22 of the semiconductor element 2, a rear surface electrode is disposed (not illustrated). The rear surface electrode covers the rear surface 22 of the semiconductor element 2. The rear surface electrode has electrical conductivity. The rear surface electrode is constituted of, for example, nickel (Ni). The rear surface electrode is electrically connected to, for example, the collector region provided in the semiconductor element 2.

The first heat radiator 5 is connected to the rear surface 22 (an example of the first surface) of the semiconductor element 2. The first heat radiator 5 is connected to the rear surface 22 of the semiconductor element 2 by solder 91. The first heat radiator 5 is connected to the rear surface electrode provided on the rear surface 22 of the semiconductor element 2. The first heat radiator 5 is electrically connected to the rear surface electrode. Sn-based solder, SnCu-based solder, Zn-based solder, and the like can be used as the solder 91, for example.

The first heat radiator 5 includes a first outer heat conductor 53, a first inner heat conductor 51, and a second inner heat conductor 52. The first outer heat conductor 53 is connected to the rear surface 22 of the semiconductor element 2. The first outer heat conductor 53 is connected, by the solder 91, to the rear surface electrode provided on the rear surface 22 of the semiconductor element 2. The first outer heat conductor 53 is electrically connected to the rear surface electrode.

The first outer heat conductor 53 is constituted of, for example, copper (Cu). The first outer heat conductor 53 may be constituted of metal other than copper (Cu). The first outer heat conductor 53 has electrical conductivity. The first outer heat conductor 53 is given a box shape. The first outer heat conductor 53 is given a rectangular parallelepiped shape.

The first outer heat conductor 53 includes an upper surface 536, a lower surface 537, and a side surface 538. The upper surface 536 of the first outer heat conductor 53 is oriented toward a semiconductor element 2 side in the Z direction. The lower surface 537 is oriented toward a side opposite to the semiconductor element 2 side in the Z direction. The lower surface 537 of the first outer heat conductor 53 contacts a cooler 201. The cooler 201 cools the first heat radiator 5. The side surface 538 of the first outer heat conductor 53 is positioned between the upper surface 536 and the lower surface 537. The side surface 538 is oriented outward in an X direction and a Y direction (the side surface 538 in the Y direction is not illustrated).

Figure 2:
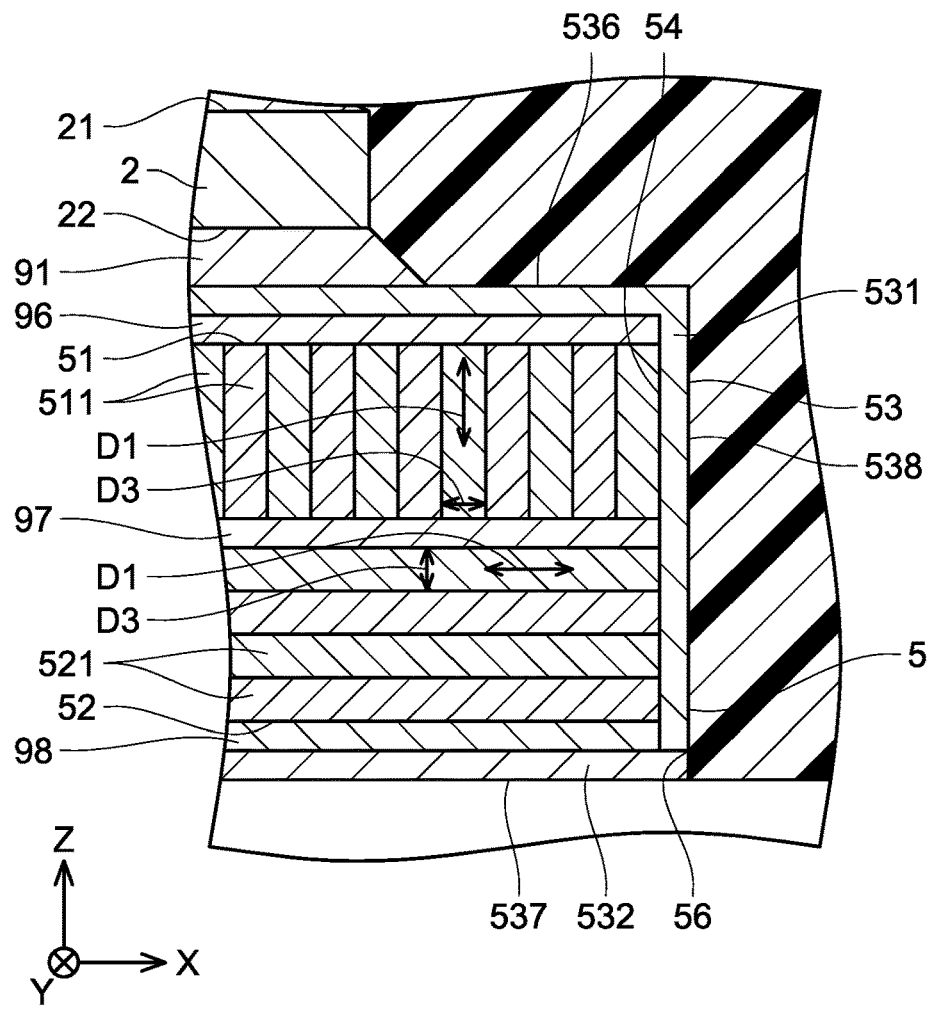
FIG. 2 is an enlarged view of a main part II in FIG. 1.

As illustrated in FIG. 2, the first outer heat conductor 53 includes a first metal member 531 and a second metal member 532. FIG. 2 omits the sealing resin 90. The first metal member 531 is connected to the semiconductor element 2. The first metal member 531 is disposed between the semiconductor element 2 and the second metal member 532.

The first metal member 531 is connected to a surface of the second metal member 532 on the semiconductor element 2 side. The second metal member 532 is connected to the first metal member 531. The second metal member 532 is connected to a surface of the first metal member 531 on the side opposite to the semiconductor element 2 side.

A boundary portion 56 between the first metal member 531 and the second metal member 532 of the first outer heat conductor 53 does not exist on the upper surface 536 or the lower surface 537 of the first outer heat conductor 53. The boundary portion 56 between the first metal member 531 and the second metal member 532 exists on the side surface 538 of the first outer heat conductor 53.

The first outer heat conductor 53 accommodates the first inner heat conductor 51 and the second inner heat conductor 52. The first outer heat conductor 53 surrounds the first inner heat conductor 51 and the second inner heat conductor 52. The first outer heat conductor 53 includes an accommodation space 54. The accommodation space 54 is provided in the first outer heat conductor 53.

The first inner heat conductor 51 is disposed in the first outer heat conductor 53. The first inner heat conductor 51 is disposed in the accommodation space 54 of the first outer heat conductor 53. The first inner heat conductor 51 is disposed on a side closer to the semiconductor element 2 with respect to the second inner heat conductor 52.

The first inner heat conductor 51 includes a plurality of first graphite layers 511. The plurality of first graphite layers 511 is stacked in a first direction (the X direction) which is orthogonal to a direction (the Z direction) in which the semiconductor element 2 and the first heat radiator 5 are arranged. Each of the first graphite layers 511 is constituted of graphite. Each of the first graphite layers 511 is configured by a plurality of graphene layers (not illustrated) being stacked. Heat conductivity of graphite in its high heat conductivity direction is higher than heat conductivity of metal. Heat conductivity of copper (Cu) is approximately 390 W/mK. Moreover, heat conductivity of silver (Ag) is approximately 420 W/mK.

Figure 3:
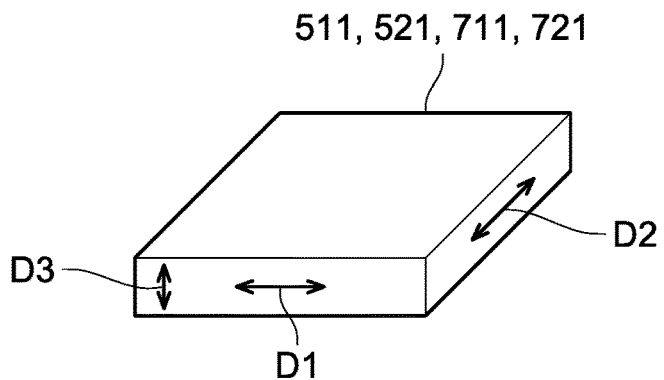
FIG. 3 is a perspective view of each graphite layer according to the first embodiment.

The first graphite layers 511 have anisotropic heat conductivity because of a bonding relation of carbon atoms. The heat conductivity is relatively high in a direction and is relatively low in another direction. As illustrated in FIG. 3, in each first graphite layer 511, the heat conductivity in its in-plane directions (a first high heat-conductivity direction D1 and a second high heat-conductivity direction D2) is higher than the heat conductivity in its out-plane direction (a low heat conductivity direction D3). The heat conductivity in the first high heat-conductivity direction D1 and the second high heat-conductivity direction D2 is approximately 800 to 1900 W/mK. The heat conductivity in the low heat conductivity direction D3 is approximately 3 to 10 W/mK. The first high heat-conductivity direction D1, the second high heat-conductivity direction D2, and the low heat conductivity direction D3 are orthogonal to each other. The out-plane direction (the low heat conductivity direction D3) of the first graphite layer 511 is a thickness direction of the first graphite layer 511.

As illustrated in FIG. 2, each first graphite layer 511 is disposed such that its first high heat-conductivity direction D1 coincides with the direction (the Z direction) in which the semiconductor element 2 and the first heat radiator 5 are arranged. Each first graphite layer 511 is disposed such that its low heat conductivity direction D3 is orthogonal to the direction (the Z direction) in which the semiconductor element 2 and the first heat radiator 5 are arranged. Each first graphite layer 511 conducts heat with high heat conductivity in the Z direction. Each first graphite layer 511 does not conduct much heat in the first direction (the X direction) in which the plurality of first graphite layers 511 is stacked, which is orthogonal to the Z direction. Each first graphite layer 511 conducts heat with high heat conductivity in a second direction (the Y direction) which is orthogonal to the Z direction and orthogonal to the first direction (the X direction).

The second inner heat conductor 52 is disposed in the first outer heat conductor 53. The second inner heat conductor 52 is disposed in the accommodation space 54 of the first outer heat conductor 53. The second inner heat conductor 52 is disposed on a side farther from the semiconductor element 2 with respect to the first inner heat conductor 51.

The second inner heat conductor 52 includes a plurality of second graphite layers 521. The plurality of second graphite layers 521 is stacked in the direction (the Z direction) in which the semiconductor element 2 and the first heat radiator 5 are arranged. Each of the second graphite layers 521 is constituted of graphite. Each of the second graphite layers 521 is configured by a plurality of graphene layers (not illustrated) being stacked.

The second graphite layers 521 have anisotropic heat conductivity because of the bonding relation of carbon atoms. The heat conductivity is relatively high in a direction, and relatively low in another direction. As illustrated in FIG. 3, in each graphite layer 521, the heat conductivity in its in-plane directions (the first high heat-conductivity direction D1 and the second high heat-conductivity direction D2) is higher than the heat conductivity in its out-plane direction (the low heat conductivity direction D3). The heat conductivity in the first high heat-conductivity direction D1 and the second high heat-conductivity direction D2 is approximately 800 to 1900 W/mK. The heat conductivity in the low heat conductivity direction D3 is approximately 3 to 10 W/mK. The first high heat-conductivity direction D1, the second high heat-conductivity direction D2, and the low heat conductivity direction D3 are orthogonal to each other. The out-plane direction (the low heat conductivity direction D3) of the second graphite layer 521 is a thickness direction of the second graphite layer 521.

As illustrated in FIG. 2, each second graphite layer 521 is disposed such that its first high heat-conductivity direction D1 is orthogonal to the direction (the Z direction) in which the semiconductor element 2 and the first heat radiator 5 are arranged. Each second graphite layer 521 is disposed such that its low heat conductivity direction D3 coincides with the direction (the Z direction) in which the semiconductor element 2 and the first heat radiator 5 are arranged. Each second graphite layer 521 does not conduct much heat in the Z direction. Each second graphite layer 521 conducts heat with high heat conductivity in the first direction (the X direction) and the second direction (the Y direction) which are orthogonal to the Z direction.

The first inner heat conductor 51 and the second inner heat conductor 52 are stacked in the Z direction. A brazing material 96 is disposed between the first outer heat conductor 53 and the first inner heat conductor 51. A brazing material 97 is disposed between the first inner heat conductor 51 and the second inner heat conductor 52. A brazing material 98 is disposed between the first outer heat conductor 53 and the second inner heat conductor 52. The first inner heat conductor 51 and the second inner heat conductor 52 are connected by the brazing material 97. The first outer heat conductor 53 and the first inner heat conductor 51 are connected by the brazing material 96. The first outer heat conductor 53 and the second inner heat conductor 52 are connected by the brazing material 98.

For example, an Ag-based brazing material and the like can be used as each of the brazing materials 96, 97, 98. Each of the brazing materials 96, 97, 98 contains titanium (Ti). Each of the brazing materials 96, 97, 98 has a titanium (Ti) content rate of, for example, 5 wt % or less. The titanium (Ti) content rate may be 3 to 5 wt %. Moreover, the titanium (Ti) content rate may be 3 wt % or less. Each of the brazing materials 96, 97, 98 has a Z-direction thickness of, for example, 50 μm. The Z-direction thickness may be 50 μm or less. Moreover, the Z-direction thickness may be 25 μm or less.

As illustrated in FIG. 1, the electrically conductive plate 3 is connected to the front surface 21 (an example of the second surface) of the semiconductor element 2. The front surface 21 of the semiconductor element 2 is a surface opposite to the rear surface 22. The electrically conductive plate 3 is connected to the front surface 21 of the semiconductor element 2 by solder 92. The electrically conductive plate 3 is connected to the front surface electrode provided on the front surface 21 of the semiconductor element 2.

The electrically conductive plate 3 is given a plate shape. The electrically conductive plate 3 is constituted of, for example, copper (Cu). The electrically conductive plate 3 has electrical conductivity and heat conductivity. The electrically conductive plate 3 is disposed between the semiconductor element 2 and the second heat radiator 7, and functions as a spacer therebetween.

The second heat radiator 7 is connected to the electrically conductive plate 3. The second heat radiator 7 is connected to the electrically conductive plate 3 by solder 93. The second heat radiator 7 is connected to the front surface 21 of the semiconductor element 2 via the solder 92, the solder 93 and the electrically conductive plate 3. The second heat radiator 7 is connected to the front surface electrode provided on the front surface 21 of the semiconductor element 2. The second heat radiator 7 is electrically connected to the front surface electrode. For example, Sn-based solder, SnCu-based solder, Zn-based solder, and the like can be used as the solder 92 and the solder 93.

The second heat radiator 7 includes a second outer heat conductor 73, a third inner heat conductor 71, and a fourth inner heat conductor 72. The second outer heat conductor 73 is connected to the front surface 21 of the semiconductor element 2 via the solder 92, the solder 93 and the electrically conductive plate 3. The second outer heat conductor 73 is connected to the front surface electrode provided on the front surface 21 of the semiconductor element 2 via the solder 92, the solder 93 and the electrically conductive plate 3. The second outer heat conductor 73 is electrically connected to the front surface electrode.

The second outer heat conductor 73 is constituted of, for example, copper (Cu). The second outer heat conductor 73 may be constituted of metal other than copper (Cu). The second outer heat conductor 73 has electrical conductivity. The second outer heat conductor 73 is given a box shape. The second outer heat conductor 73 is given a rectangular parallelepiped shape.

The second outer heat conductor 73 includes a lower surface 736, an upper surface 737, and a side surface 738. The lower surface 736 of the second outer heat conductor 73 is oriented toward a semiconductor element 2 side in the Z direction. The upper surface 737 is oriented toward a side opposite to the semiconductor element 2 side in the Z direction. The upper surface 737 of the second outer heat conductor 73 contacts a cooler 202. The cooler 202 cools the second heat radiator 7. The side surface 738 of the second outer heat conductor 73 is positioned between the lower surface 736 and the upper surface 737. The side surface 738 is oriented outward in the X direction and the Y direction (the side surface 738 in the Y direction is not illustrated).

Figure 4:
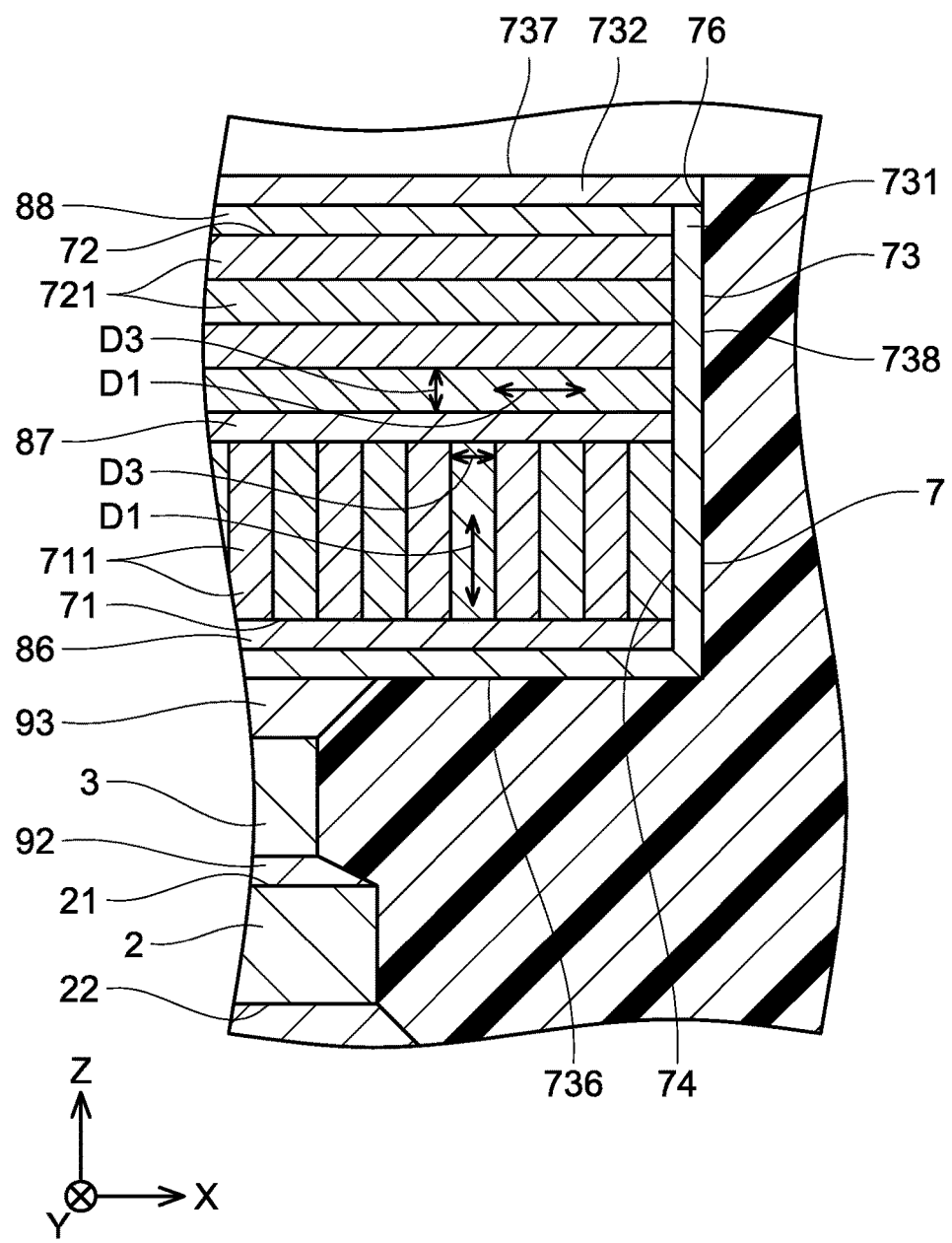
FIG. 4 is an enlarged view of a main part IV in FIG. 1.

As illustrated in FIG. 4, the second outer heat conductor 73 includes a first metal member 731 and a second metal member 732. FIG. 4 omits the sealing resin 90. The first metal member 731 is connected to the semiconductor element 2 via the solder 92, the solder 93 and the electrically conductive plate 3. The first metal member 731 is disposed between the electrically conductive plate 3 and the second metal member 732. The first metal member 731 is connected to a surface of the second metal member 732 on an electrically conductive plate 3 side. The second metal member 732 is connected to the first metal member 731. The second metal member 732 is connected to a surface of the first metal member 731 on a side opposite to the electrically conductive plate 3 side.

A boundary portion 76 between the first metal member 731 and the second metal member 732 of the second outer heat conductor 73 does not exist on the lower surface 736 or the upper surface 737 of the second outer heat conductor 73. The boundary portion 76 between the first metal member 731 and the second metal member 732 exists on the side surface 738 of the second outer heat conductor 73.

The second outer heat conductor 73 accommodates the third inner heat conductor 71 and the fourth inner heat conductor 72. The second outer heat conductor 73 surrounds the third inner heat conductor 71 and the fourth inner heat conductor 72. The second outer heat conductor 73 includes an accommodation space 74. The accommodation space 74 is provided in the second outer heat conductor 73.

The third inner heat conductor 71 is disposed in the second outer heat conductor 73. The third inner heat conductor 71 is disposed in the accommodation space 74 of the second outer heat conductor 73. The third inner heat conductor 71 is disposed on a side closer to the semiconductor element 2 with respect to the fourth inner heat conductor 72.

The third inner heat conductor 71 includes a plurality of third graphite layers 711. The plurality of third graphite layers 711 is stacked in the first direction (the X direction) which is orthogonal to a direction (the Z direction) in which the semiconductor element 2 and the second heat radiator 7 are arranged. Each of the third graphite layers 711 is constituted of graphite. Each of the third graphite layers 711 is configured by a plurality of graphene layers (not illustrated) being stacked.

The third graphite layers 711 have anisotropic heat conductivity because of the bonding relation of carbon atoms. The heat conductivity is relatively high in a direction and is relatively low in another direction. As illustrated in FIG. 3, in each third graphite layer 711, the heat conductivity in its in-plane directions (the first high heat-conductivity direction D1 and the second high heat-conductivity direction D2) is higher than the heat conductivity in its out-plane direction (the low heat conductivity direction D3). The heat conductivity in the first high heat-conductivity direction D1 and the second high heat-conductivity direction D2 is approximately 800 to 1900 W/mK. The heat conductivity in the low heat conductivity direction D3 is approximately 3 to 10 W/mK. The first high heat conductivity direction D1, the second high heat conductivity direction D2, and the low heat conductivity direction D3 are orthogonal to each other. The out-plane direction (the low heat conductivity direction D3) of the third graphite layer 711 is a thickness direction of the third graphite layer 711.

As illustrated in FIG. 4, each third graphite layer 711 is disposed such that its first high heat-conductivity direction D1 coincides with the direction (the Z direction) in which the semiconductor element 2 and the second heat radiator 7 are arranged. Each third graphite layer 711 is disposed such that its low heat conductivity direction D3 is orthogonal to the direction (the Z direction) in which the semiconductor element 2 and the second heat radiator 7 are arranged. Each third graphite layer 711 conducts heat with high heat conductivity in the Z direction. Each third graphite layer 711 does not conduct much heat in the first direction (the X direction) in which the plurality of third graphite layers 711 is stacked, which is orthogonal to the Z direction. Each third graphite layer 711 conducts heat with high heat conductivity in the second direction (the Y direction) which is orthogonal to the Z direction and orthogonal to the first direction (the X direction).

The fourth inner heat conductor 72 is disposed in the second outer heat conductor 73. The fourth inner heat conductor 72 is disposed in the accommodation space 74 of the second outer heat conductor 73. The fourth inner heat conductor 72 is disposed on a side farther from the semiconductor element 2 with respect to the third inner heat conductor 71.

The fourth inner heat conductor 72 includes a plurality of fourth graphite layers 721. The plurality of fourth graphite layers 721 is stacked in the direction (the Z direction) in which the semiconductor element 2 and the second heat radiator 7 are arranged. Each of the fourth graphite layers 721 is constituted of graphite. Each of the fourth graphite layers 721 is constituted by a plurality of graphene layers (not illustrated) being stacked.

The fourth graphite layers 721 have anisotropic heat conductivity because of the bonding relation of carbon atoms. The heat conductivity is relatively high in a direction and is relatively low in another direction. As illustrated in FIG. 3, in each fourth graphite layer 721, the heat conductivity in its in-plane directions (the first high heat-conductivity direction D1 and the second high heat-conductivity direction D2) is higher than the heat conductivity in its out-plane direction (the low heat conductivity direction D3). The heat conductivity in the first high heat-conductivity direction D1 and the second high heat-conductivity direction D2 is approximately 800 to 1900 W/mK. The heat conductivity in the low heat conductivity direction D3 is approximately 3 to 10 W/mK. The first high heat-conductivity direction D1, the second high heat-conductivity direction D2, and the low heat conductivity direction D3 are orthogonal to each other. The out-plane direction (the low heat conductivity direction D3) of the fourth graphite layer 721 is a thickness direction of the fourth graphite layer 721.

As illustrated in FIG. 4, each fourth graphite layer 721 is disposed such that its first high heat-conductivity direction D1 is orthogonal to the direction (the Z direction) in which the semiconductor element 2 and the second heat radiator 7 are arranged. Each fourth graphite layer 721 is disposed such that its low heat conductivity direction D3 coincides with the direction (the Z direction) in which the semiconductor element 2 and the second heat radiator 7 are arranged. Each fourth graphite layer 721 does not conduct much heat in the Z direction. Each fourth graphite layer 721 conducts heat with high heat conductivity in the first direction (the X direction) and the second direction (the Y direction) which are orthogonal to the Z direction.

The third inner heat conductor 71 and the fourth inner heat conductor 72 are stacked in the Z direction. A brazing material 86 is disposed between the second outer heat conductor 73 and the third inner heat conductor 71. A brazing material 87 is disposed between the third inner heat conductor 71 and the fourth inner heat conductor 72. A brazing material 88 is disposed between the second outer heat conductor 73 and the fourth inner heat conductor 72. For example, an Ag-based brazing material and the like can be used as the brazing materials 86, 87, 88. The third inner heat conductor 71 and the fourth inner heat conductor 72 are connected by the brazing material 87. The second outer heat conductor 73 and the third inner heat conductor 71 are connected by the brazing material 86. The second outer heat conductor 73 and the fourth inner heat conductor 72 are connected by the brazing material 88.

The semiconductor device 1 according to the first embodiment has been described above. As is clear from the description mentioned above, in the semiconductor device 1, the first heat radiator 5 includes the first outer heat conductor 53 which is constituted of metal and connected to the rear surface 22 of the semiconductor element 2, and the first inner heat conductor 51 and the second inner heat conductor 52 which are disposed in the first outer heat conductor 53. The first inner heat conductor 51 and the second inner heat conductor 52 are stacked in the direction (the Z direction) in which the semiconductor element 2 and the first heat radiator 5 are arranged. The first inner heat conductor 51 includes the plurality of first graphite layers 511. The plurality of first graphite layers 511 is stacked in the first direction (the X direction) which is orthogonal to the direction (the Z direction) in which the semiconductor element 2 and the first heat radiator 5 are arranged. The second inner heat conductor 52 includes the plurality of second graphite layers 521. The plurality of second graphite layers 521 is stacked in the direction (the Z direction) in which the semiconductor element 2 and the first heat radiator 5 are arranged.

According to this configuration, heat generated by an operation of the semiconductor element 2 is radiated by the first heat radiator 5. The heat generated in the semiconductor element 2 is conducted to the first outer heat conductor 53 connected to the semiconductor element 2, then to the first inner heat conductor 51 and the second inner heat conductor 52 both disposed in the first outer heat conductor 53, and again to the first outer heat conductor 53, and is radiated to an outside.

Graphite has heat conductivity higher than heat conductivity of metal. The first heat radiator 5, which includes the plurality of first graphite layers 511 and the plurality of second graphite layers 521, can thereby conduct heat more efficiently than in a case of including only metal.

The plurality of first graphite layers 511, which constitutes the first inner heat conductor 51, has anisotropic heat conductivity. Each first graphite layer 511 does not conduct much heat in the first direction (the X direction) in which the plurality of first graphite layers 511 is stacked. In contrast to this, each first graphite layer 511 conducts heat with high heat conductivity in the directions (the Y direction and the Z direction) orthogonal to the first direction (the X direction) in which the plurality of first graphite layers 511 is stacked. Therefore, the first inner heat conductor 51 conducts heat with high heat conductivity in the direction (the Z direction) in which the semiconductor element 2 and the first heat radiator 5 are arranged. Moreover, the first inner heat conductor 51 conducts heat with high heat conductivity in the second direction (the Y direction) orthogonal to both of the Z direction and the first direction (the X direction).

Similarly, the plurality of second graphite layers 521, which constitutes the second inner heat conductor 52, has anisotropic heat conductivity. Each second graphite layer 521 does not conduct much heat in the direction (the Z direction) in which the plurality of second graphite layers 521 is stacked. In contrast to this, each second graphite layer 521 conducts heat with high heat conductivity in the directions (the X direction and the Y direction) orthogonal to the direction (the Z direction) in which the plurality of second graphite layers 521 is stacked. Therefore, the second inner heat conductor 52 conducts heat with high heat conductivity in the first direction (the X direction) and the second direction (the Y direction) which are both orthogonal to the direction (the Z direction) in which the semiconductor element 2 and the first heat radiator 5 are arranged.

According to the configuration above, the heat generated in the semiconductor element 2 can be conducted to the first inner heat conductor 51 and the second inner heat conductor 52 by the first outer heat conductor 53 constituted of metal. Moreover, the heat can be conducted with high heat conductivity in the direction (the Z direction) in which the semiconductor element 2 and the first heat radiator 5 are arranged, the first direction (the X direction), and the second direction (the Y direction), by the first inner heat conductor 51 and the second inner heat conductor 52. Moreover, the heat conducted by the first inner heat conductor 51 and the second inner heat conductor 52 can be radiated in multiple directions by the first outer heat conductor 53. Therefore, according to the configuration above, the heat generated in the semiconductor element 2 can be conducted efficiently and radiated in multiple directions by the first outer heat conductor 53, the first inner heat conductor 51, and the second inner heat conductor 52 of the first heat radiator 5, so heat radiation performance can be improved. If the stacking direction of the plurality of first graphite layers 511 and the stacking direction of the plurality of second graphite layers 521 coincide with each other, the heat conducting directions of them also coincide with each other, which results in a failure to radiate heat in multiple directions.

Moreover, the semiconductor device 1 includes the second heat radiator 7 connected to the front surface 21 of the semiconductor element 2. The second heat radiator 7 includes a configuration similar to the configuration of the first heat radiator 5. Therefore, the heat radiation performance can be improved not only on a rear surface 22 side of the semiconductor element 2 but also on a front surface 21 side thereof, which is opposite to the rear surface 22 side.

One embodiment has been described above, however, specific aspects are not limited to the embodiment above. In the following description, configurations similar to those mentioned above will be denoted with the same reference signs, and description thereof will be omitted.

Second Embodiment

Figure 5:
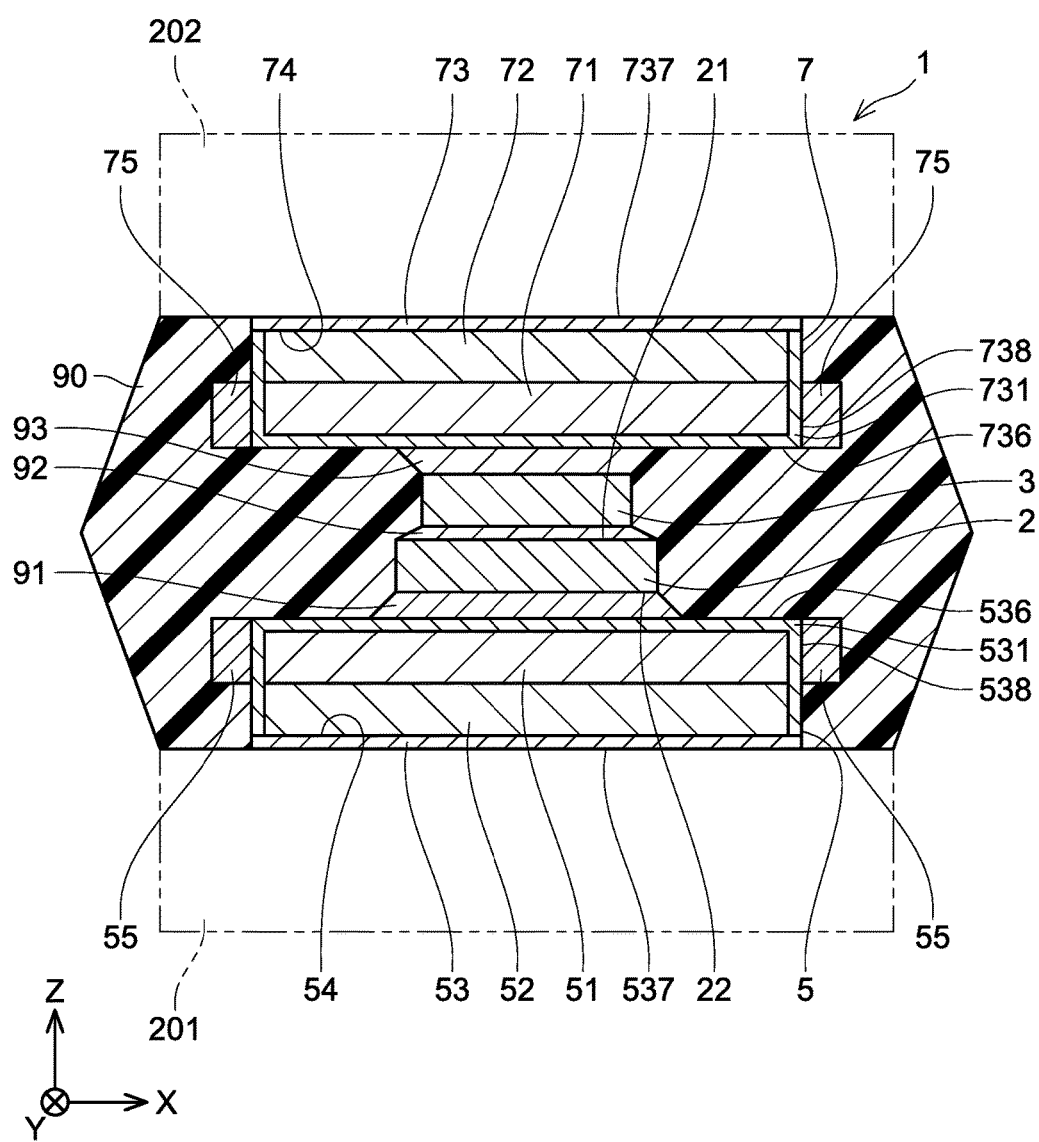
FIG. 5 is a cross-sectional view of a semiconductor device according to a second embodiment.

As illustrated in FIG. 5, in the semiconductor device 1 according to a second embodiment, the first outer heat conductor 53 of the first heat radiator 5 may additionally include a projection 55 projecting outward. The projection 55 is constituted of, for example, copper (Cu). The projection 55 may be constituted of metal other than copper (Cu). The projection 55 is fixed to the first metal member 531 of the first outer heat conductor 53. The projection 55 is formed integrally with or separately from the first metal member 531 of the first outer heat conductor 53. The projection 55 is sealed by the sealing resin 90. The projection 55 projects in the first direction (the X direction) which is orthogonal to the direction (the Z direction) in which the semiconductor element 2 and the first heat radiator 5 are arranged. The projection 55 also projects in the second direction (the Y direction) which is orthogonal to the first direction (the X direction) (not illustrated).

Similarly, the second outer heat conductor 73 of the second heat radiator 7 may additionally include a projection 75 projecting outward. The projection 75 is constituted of, for example, copper (Cu). The projection 75 may be constituted of metal other than copper (Cu). The projection 75 is fixed to the first metal member 731 of the second outer heat conductor 73. The projection 75 is formed integrally with or separately from the first metal member 731 of the second outer heat conductor 73. The projection 75 is sealed by the sealing resin 90. The projection 75 projects in the first direction (the X direction) which is orthogonal to the direction (the Z direction) in which the semiconductor element 2 and the second heat radiator 7 are arranged. The projection 75 also projects in the second direction (the Y direction) which is orthogonal to the first direction (the X direction) (not illustrated).

Figure 6:
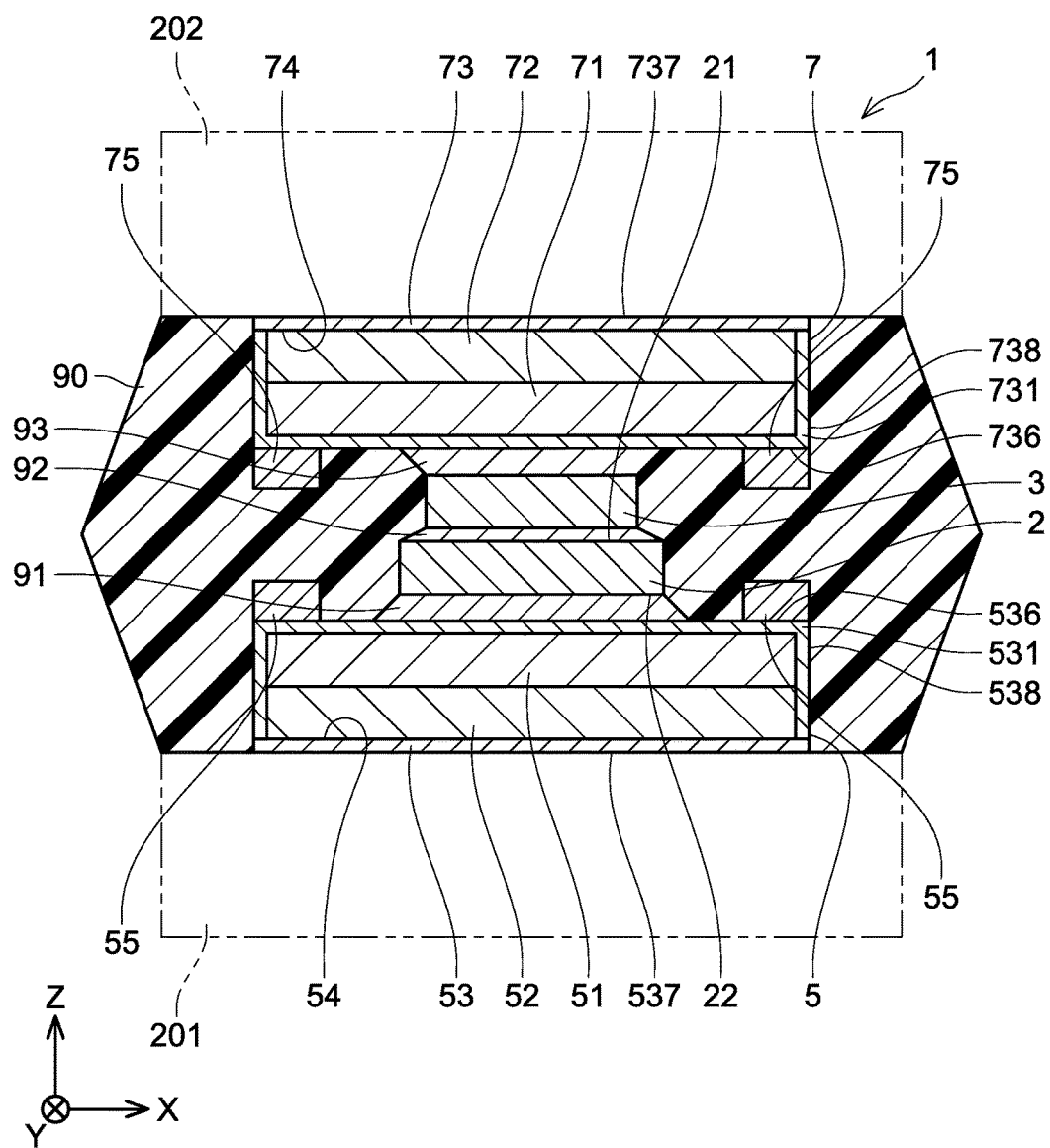
FIG. 6 is a cross-sectional view of a semiconductor device according to a variant of the second embodiment.

Moreover, as illustrated in FIG. 6, the projection 55 of the first heat radiator 5 may project in the direction (the Z direction) in which the semiconductor element 2 and the first heat radiator 5 are arranged. Similarly, the projection 75 of the second heat radiator 7 may project in the direction (the Z direction) in which the semiconductor element 2 and the second heat radiator 7 are arranged.

Graphite has heat capacity smaller than heat capacity of metal. Therefore, in the configuration where the first heat radiator 5 includes the plurality of first graphite layers 511 and the plurality of second graphite layers 521, the first heat radiator 5 has heat capacity smaller than in a case where the first heat radiator 5 is constituted only of metal. According to the configuration above, since the first outer heat conductor 53 includes the projection 55 constituted of metal, the heat capacity of the first heat radiator 5 can be improved. Therefore, it is possible to suppress a sharp increase in temperature of the first heat radiator 5 when the heat generated in the semiconductor element 2 is conducted to the first heat radiator 5. The same applies to the second heat radiator 7.

Moreover, in the semiconductor device 1 above, the boundary portion 56 between the first metal member 531 and the second metal member 532 of the first outer heat conductor 53 does not exist on the upper surface 536 or the lower surface 537 of the first outer heat conductor 53. The boundary portion 56 between the first metal member 531 and the second metal member 532 exists on the side surface 538 of the first outer heat conductor 53. Therefore, each of the upper surface 536 and the lower surface 537 of the first outer heat conductor 53 can be made as a seamless surface. The same applies to the second outer heat conductor 73.

Other Embodiments

In the embodiments above, the first inner heat conductor 51 is disposed on the side closer to the semiconductor element 2 with respect to the second inner heat conductor 52. However, no limitation is applied thereto. In some embodiments, contrary to the above, the second inner heat conductor 52 may be disposed on the side closer to the semiconductor element 2 with respect to the first inner heat conductor 51.

Similarly, in the embodiments above, the third inner heat conductor 71 is disposed on the side closer to the semiconductor element 2 with respect to the fourth inner heat conductor 72. However, no limitation is applied thereto. In some embodiments, contrary to the above, the fourth inner heat conductor 72 may be disposed on the side closer to the semiconductor element 2 with respect to the third inner heat conductor 71.

In the embodiments above, the plurality of second graphite layers 521 is stacked in the direction (the Z direction) in which the semiconductor element 2 and the first heat radiator 5 are arranged. However, no limitation is applied thereto. In some embodiments, the plurality of second graphite layers 521 may be stacked in the second direction (the Y direction) which is orthogonal to the direction (the Z direction) in which the semiconductor element 2 and the first heat radiator 5 are arranged and orthogonal to the first direction (the X direction). The first direction (the X direction) in which the plurality of first graphite layers 511 is stacked and the second direction (the Y direction) in which the plurality of second graphite layers 521 is stacked are orthogonal to each other.

Each second graphite layer 521 does not conduct much heat in the direction (the Y direction) in which the plurality of second graphite layers 521 is stacked. In contrast to this, each second graphite layer 521 conducts heat with high heat conductivity in the directions (the X direction and the Z direction) orthogonal to the direction (the Y direction) in which the plurality of second graphite layers 521 is stacked. Therefore, the second inner heat conductor 52 can conduct heat with high heat conductivity in the Z direction and the X direction. The first inner heat conductor 51 and the second inner heat conductor 52 can conduct heat with high heat conductivity in the X direction, the Y direction, and the Z direction. Heat can be conducted efficiently especially in the Z direction.

Similarly, in the embodiments above, the plurality of fourth graphite layers 721 is stacked in the direction (the Z direction) in which the semiconductor element 2 and the second heat radiator 7 are arranged. However, no limitation is applied thereto. In some embodiments, the plurality of fourth graphite layers 721 may be stacked in the second direction (the Y direction) which is orthogonal to the direction (the Z direction) in which the semiconductor element 2 and the second heat radiator 7 are arranged and orthogonal to the first direction (the X direction). The first direction (the X direction) in which the plurality of third graphite layers 711 is stacked and the second direction (the Y direction) in which the plurality of the fourth graphite layers 721 is stacked are orthogonal to each other. According to this configuration, as with the description above, the third inner heat conductor 71 and the fourth inner heat conductor 72 can conduct heat with high heat conductivity in the X direction, the Y direction, and the Z direction. Heat can be conducted efficiently especially in the Z direction.

In the embodiments above, the boundary portion 56 between the first metal member 531 and the second metal member 532 of the first outer heat conductor 53 does not exist on the lower surface 537 of the first outer heat conductor 53. However, no limitation is applied thereto. In some embodiments, the boundary portion 56 between the first metal member 531 and the second metal member 532 may exist on the lower surface 537 of the first outer heat conductor 53.

Similarly, in the embodiments above, the boundary portion 76 between the first metal member 731 and the second metal member 732 of the second outer heat conductor 73 does not exist on the upper surface 737 of the second outer heat conductor 73. However, no limitation is applied thereto. In some embodiments, the boundary portion 76 between the first metal member 731 and the second metal member 732 may exist on the upper surface 737 of the second outer heat conductor 73.

When the semiconductor device 1 above is manufactured, the lower surface 537 of the first outer heat conductor 53 of the first heat radiator 5 is sometimes ground with a machine tool before or after the first heat radiator 5 is connected to the semiconductor element 2. Therefore, the first outer heat conductor 53 may be provided with a grinding allowance on its lower surface 537 side.

Figure 7:
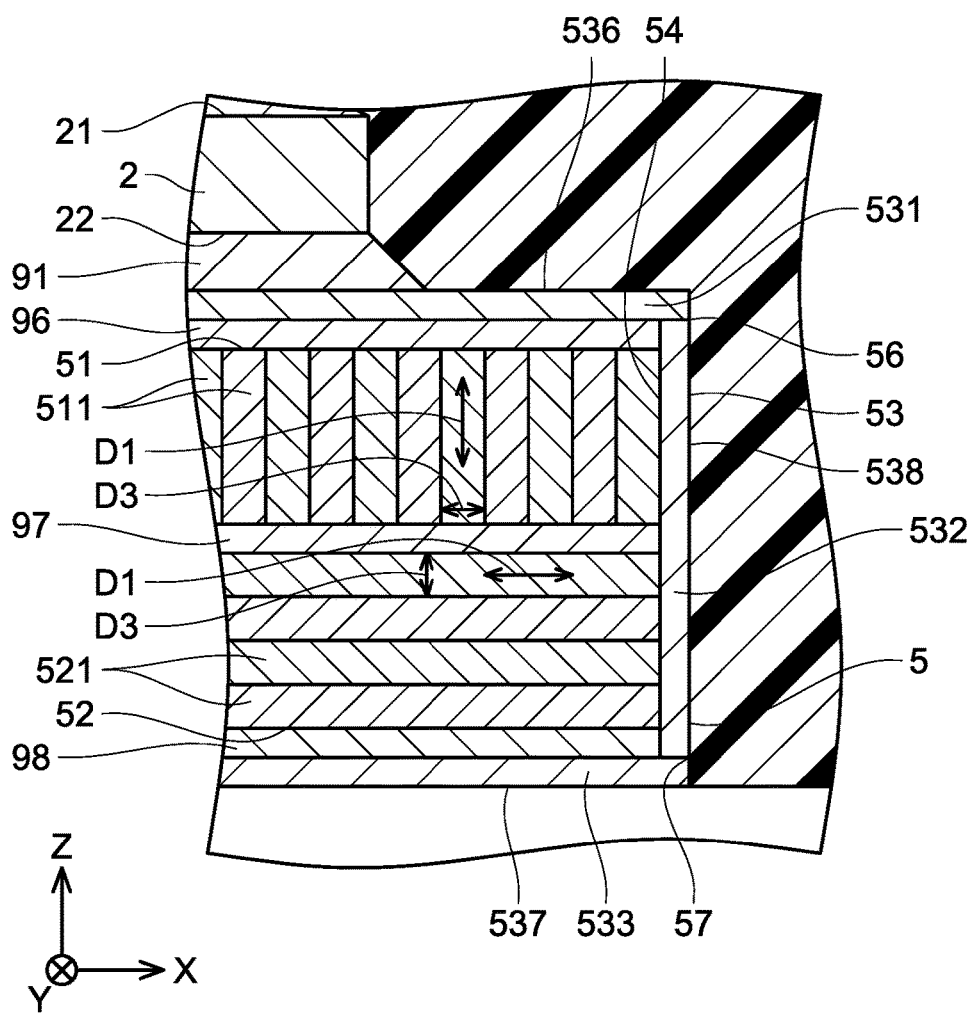
FIG. 7 is a diagram of a semiconductor device according to another embodiment, corresponding to FIG. 2.

As illustrated in FIG. 7, the first outer heat conductor 53 may include the first metal member 531, the second metal member 532, and a third metal member 533. The first metal member 531, the second metal member 532, and the third metal member 533 are arranged in the Z direction from the side closer to the semiconductor element 2 to the side farther therefrom. FIG. 7 omits the sealing resin 90. The first metal member 531 is connected to the semiconductor element 2. The first metal member 531 is disposed between the semiconductor element 2 and the second metal member 532. The first metal member 531 is connected to the surface of the second metal member 532 on the semiconductor element 2 side. The second metal member 532 is connected to the first metal member 531. The second metal member 532 is disposed between the first metal member 531 and the third metal member 533. The second metal member 532 is connected to the surface of the first metal member 531 on the side opposite to the semiconductor element 2 side. Moreover, the second metal member 532 is connected to a surface of the third metal member 533 on the semiconductor element 2 side. The third metal member 533 is connected to the second metal member 532. The third metal member 533 is connected to a surface of the second metal member 532 on the side opposite to the semiconductor element 2 side.

The boundary portion 56 between the first metal member 531 and the second metal member 532 of the first outer heat conductor 53 does not exist on the upper surface 536 or the lower surface 537 of the first outer heat conductor 53. The boundary portion 56 between the first metal member 531 and the second metal member 532 exists on the side surface 538 of the first outer heat conductor 53.

A boundary portion 57 between the second metal member 532 and the third metal member 533 of the first outer heat conductor 53 does not exist on the upper surface 536 or the lower surface 537 of the first outer heat conductor 53. The boundary portion 57 between the second metal member 532 and the third metal member 533 exists on the side surface 538 of the first outer heat conductor 53.

In the embodiments above, the second heat radiator 7 includes the second outer heat conductor 73, the third inner heat conductor 71, and the fourth inner heat conductor 72. However, no limitation is applied thereto. In other embodiments, the second heat radiator 7 may not include these configurations, and may be constituted only of metal. The second heat radiator 7 is a solid metal member, and does not include the third inner heat conductor 71 or the fourth inner heat conductor 72 therein. Metal that constitutes the second heat radiator 7 is, for example, copper (Cu) or aluminum (Al). This second heat radiator 7 is connected to the front surface 21 of the semiconductor element 2 via the solder 92, the solder 93 and the electrically conductive plate 3. The second heat radiator 7 is connected to the front surface electrode provided on the front surface 21 of the semiconductor element 2. The second heat radiator 7 is electrically connected to the front surface electrode. According to this configuration, since the second heat radiator 7 is a solid metal member, it is possible to clearly identify the second heat radiator 7 when the semiconductor device 1 is inspected by using, for example, ultrasonic waves or X-rays. Moreover, since no graphite is used for the second heat radiator 7, cost for the semiconductor device 1 can be reduced.

In the embodiments above, the electrically conductive plate 3 is disposed between the semiconductor element 2 and the second heat radiator 7 as a spacer. However, no limitation is applied thereto, and the electrically conductive plate 3 may not be provided. In this case, the second heat radiator 7 is connected to the front surface 21 of the semiconductor element 2 by the solder 92, without involving the solder 93 and the electrically conductive plate 3. According to this configuration, since the electrically conductive plate 3 is not interposed between the semiconductor element 2 and the second heat radiator 7, a contact area between the semiconductor element 2 and the second heat radiator 7 can be increased. Therefore, a heat radiation area for radiating heat generated in the semiconductor element 2 can be increased, so the heat radiation performance can be improved. Moreover, a Z-direction thickness of the semiconductor device 1 can be decreased.

First Test Example

Figure 8:
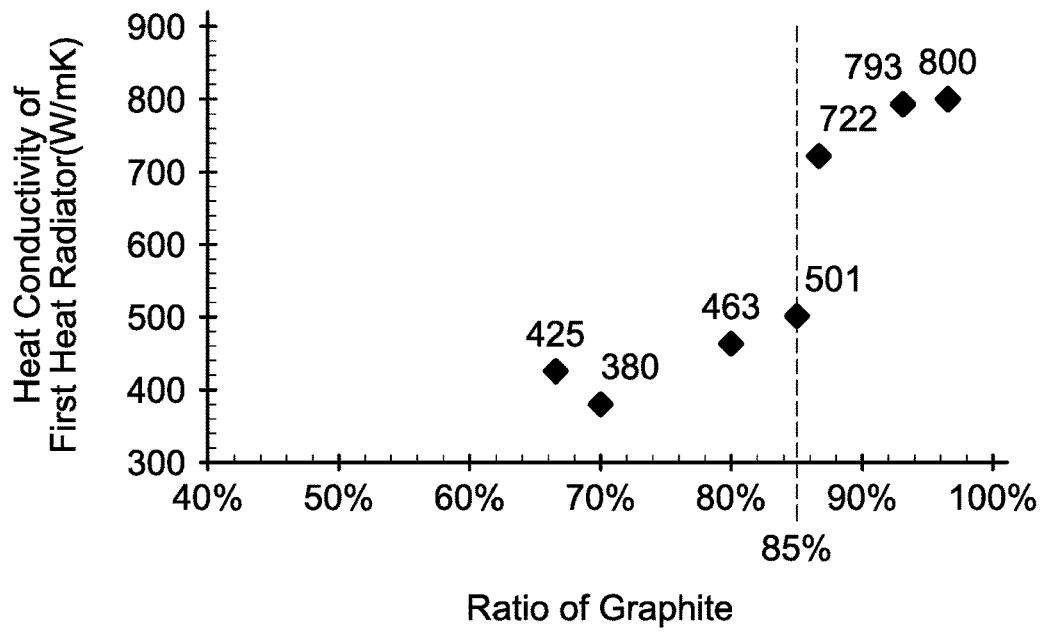
FIG. 8 is a diagram showing measurement results of a first test example.

A test was conducted on the heat conductivity of the first heat radiator 5 in the semiconductor device 1 above. In a first test example, each of the brazing materials 96, 97, 98 in the first heat radiator 5 was set to have a titanium (Ti) content rate of 3 to 5 wt %. Moreover, each of the brazing materials 96, 97, 98 was set to have a Z-direction thickness of 50 μm. Under this condition, the heat conductivity of the first heat radiator 5 was measured with various ratios of graphite in the first heat radiator 5. FIG. 8 shows the measurement results. As shown in FIG. 8, it was confirmed that the heat conductivity of the first heat radiator 5 was remarkably higher in a case where the ratio of graphite in the first heat radiator 5 was 85 wt % or more than in a case where the ratio of graphite was less than 85 wt %. Moreover, it was confirmed that the heat conductivity of the first heat radiator 5 was much higher in a case where the ratio of graphite in the first heat radiator 5 was 87 wt % or more than in a case where the ratio of graphite was less than 87 wt %. Moreover, it was confirmed that the heat conductivity of the first heat radiator 5 was much higher in a case where the ratio of graphite in the first heat radiator 5 was 93 wt % or more than in a case where the ratio of graphite was less than 93 wt %.

Second Test Example

Figure 9:
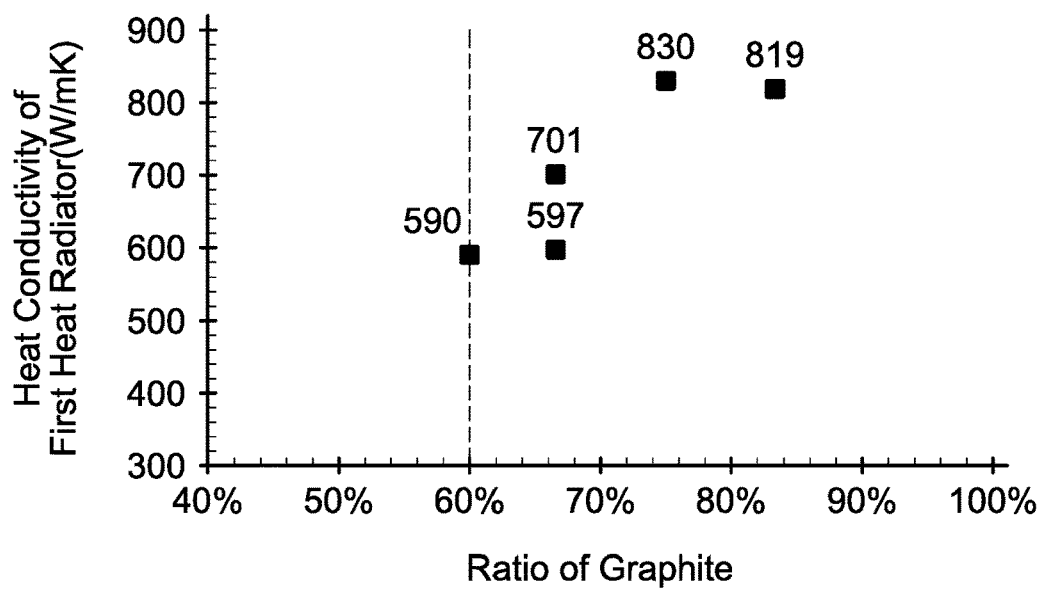
FIG. 9 is a diagram showing measurement results of a second test example.

In a second test example, each of the brazing materials 96, 97, 98 in the first heat radiator 5 was set to have a titanium (Ti) content rate of 3 wt % or less. Moreover, each of the brazing materials 96, 97, 98 was set to have a Z-direction thickness of 25 μm or less. Under this condition, the heat conductivity of the first heat radiator 5 was measured with various ratios of graphite in the first heat radiator 5. FIG. 9 shows the measurement results. As shown in FIG. 9, it was confirmed that the heat conductivity in a case where the ratio of graphite in the first heat radiator 5 was 60 wt % or more was almost the same as that in a case where the ratio of graphite was 86 wt % or more in the first test example above. Moreover, it was confirmed that the heat conductivity of the first heat radiator 5 was much higher in a case where the ratio of graphite in the first heat radiator 5 was 68 wt % or more than in a case where the ratio of graphite was less than 68 wt %. Moreover, it was confirmed that the heat conductivity of the first heat radiator 5 was much higher in a case where the ratio of graphite in the first heat radiator 5 was 74 wt % or more than in a case where the ratio of graphite was less than 74 wt %.

The X, Y, and Z directions in the embodiments above are merely for convenience of description, and are interchangeable.

What is claimed is:

1. A semiconductor device comprising:
   a semiconductor element; and
   a first heat radiator connected to a first surface of the semiconductor element,
   wherein
   the first heat radiator comprises:
      a first outer heat conductor constituted of metal and connected to the first surface of the semiconductor element;
      a first inner heat conductor disposed in the first outer heat conductor; and
      a second inner heat conductor disposed in the first outer heat conductor and stacked on the first inner heat conductor in a direction in which the semiconductor element and the first heat radiator are arranged,
   the first inner heat conductor comprises a plurality of first graphite layers,
   the second inner heat conductor comprises a plurality of second graphite layers,
   the plurality of first graphite layers is stacked in a first direction which is orthogonal to the direction in which the semiconductor element and the first heat radiator are arranged, and
   the plurality of second graphite layers is stacked in the direction in which the semiconductor element and the first heat radiator are arranged, or is stacked in a second direction which is orthogonal to the direction in which the semiconductor element and the first heat radiator are arranged and orthogonal to the first direction.

2. The semiconductor device according to claim 1, further comprising:
   a second heat radiator connected to a second surface opposite to the first surface of the semiconductor element;
   wherein
   the second heat radiator comprises:
      a second outer heat conductor constituted of metal and connected to the second surface of the semiconductor element;
      a third inner heat conductor disposed in the second outer heat conductor, and
      a fourth inner heat conductor disposed in the second outer heat conductor and stacked on the third inner heat conductor in a direction in which the semiconductor element and the second heat radiator are arranged,
   the third inner heat conductor comprises a plurality of third graphite layers,
   the fourth inner heat conductor comprises a plurality of fourth graphite layers,
   the plurality of third graphite layers is stacked in a third direction which is orthogonal to the direction in which the semiconductor element and the second heat radiator are arranged, and
   the plurality of fourth graphite layers is stacked in the direction in which the semiconductor element and the second heat radiator are arranged, or is stacked in a fourth direction which is orthogonal to the direction in which the semiconductor element and the second heat radiator are arranged and orthogonal to the third direction.

3. The semiconductor device according to claim 1, further comprising:
   a second heat radiator connected to a second surface opposite to the first surface of the semiconductor element;
   wherein the second heat radiator is a solid metal member.

4. The semiconductor device according to claim 1, wherein
   the semiconductor element, the first heat radiator and the second heat radiator are scaled by a sealing resin.

5. The semiconductor device according to claim 1, wherein
   the first outer heat conductor comprises a projection projecting outward.

* * * * *